(12) United States Patent
Ho et al.

(10) Patent No.: US 8,810,045 B2
(45) Date of Patent: Aug. 19, 2014

(54) PACKAGING SUBSTRATE AND SEMICONDUCTOR PACKAGE

(71) Applicant: Siliconware Precision Industries Co., Ltd., Taichung (TW)

(72) Inventors: Chi-Ching Ho, Taichung (TW); Yu-Chih Yu, Taichung (TW); Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/644,561

(22) Filed: Oct. 4, 2012

(65) Prior Publication Data
US 2013/0334694 A1 Dec. 19, 2013

(30) Foreign Application Priority Data
Jun. 14, 2012 (TW) .............................. 101121271 A

(51) Int. Cl.
*H01L 23/28* (2006.01)
(52) U.S. Cl.
USPC ........... 257/787; 257/691; 257/693; 257/697; 257/786
(58) Field of Classification Search
USPC ......... 257/666–667, 678, 676, 691, 697–698, 257/786–787
See application file for complete search history.

(56) References Cited

U.S. PATENT DOCUMENTS

| 5,847,458 | A * | 12/1998 | Nakamura et al. | 257/738 |
| 6,025,650 | A * | 2/2000 | Tsuji et al. | 257/786 |
| 6,759,271 | B2 * | 7/2004 | Miyazaki | 438/108 |
| 2008/0079127 | A1 * | 4/2008 | Gerber | 257/676 |
| 2010/0258920 | A1 * | 10/2010 | Chien et al. | 257/666 |
| 2010/0258934 | A1 * | 10/2010 | Chang Chien et al. | 257/690 |

* cited by examiner

*Primary Examiner* — Dung A. Le
(74) *Attorney, Agent, or Firm* — Edwards Wildman Palmer LLP; Peter F. Corless; Steven M. Jensen

(57) ABSTRACT

A packaging substrate and a semiconductor package each include: a metal board having a first surface and a second surface opposite to the first surface, wherein the first surface has a plurality of first openings for defining a first core circuit layer therebetween, the second surface has a plurality of second openings for defining a second core circuit layer therebetween, each of the first and second openings has a wide outer portion and a narrow inner portion, and the inner portion of each of the second openings is in communication with the inner portion of a corresponding one of the first openings; a first encapsulant formed in the first openings; a second encapsulant formed in the second openings; and a surface circuit layer formed on the first encapsulant and the first core circuit layer.

9 Claims, 13 Drawing Sheets

PACKAGING SUBSTRATE AND SEMICONDUCTOR PACKAGE

CROSS-REFERENCE TO RELATED APPLICATIONS

This application claims under 35 U.S.C.§119(a) the benefit of Taiwanese Application No. 101121271, filed Jun. 14, 2012, the entire contents of which is incorporated herein by reference.

BACKGROUND OF THE INVENTION

1. Field of the Invention

The present invention relates to packaging substrates, semiconductor packages and fabrication methods thereof, and, more particularly, to a carrier-free packaging substrate, a semiconductor package and a fabrication method thereof.

2. Description of Related Art

A conventional packaging substrate has a core board and build-up structures symmetrically formed on both sides of the core board. The use of the core board increases the length of the conductive path and the thickness of the overall structure, thus hindering miniaturization of electronic products. Accordingly, coreless packaging substrates are provided to shorten the conductive path and reduce the thickness of the overall structure so as to meet high frequency and miniaturization requirements.

FIGS. 1A to 1L are schematic cross-sectional views showing a conventional coreless packaging substrate and a fabrication method thereof.

Referring to FIG. 1A, a carrier 10 having a first surface 10a and a second surface 10b opposite to the first surface 10a is provided.

Referring to FIG. 1B, a first conductive layer 11a and a second conductive layer 11b are formed on the first surface 10a and the second surface 10b, respectively.

Referring to FIG. 1C, a first resist layer 12 is formed on the first conductive layer 11a and has a plurality of openings 120 for exposing portions of the first conductive layer 11a.

Referring to FIG. 1D, a first metal layer 13 is formed in the openings 120 of the first resist layer 12 by electroplating.

Referring to FIG. 1E, a second resist layer 14 is formed on the first resist layer 12 and the first metal layer 13 and has a plurality of openings 140 for exposing portions of the first metal layer 13.

Referring to FIG. 1F, a second metal layer 15 is formed in the openings 140 of the second resist layer 14 by electroplating.

Referring to FIG. 1G the first resist layer 12 and the second resist layer 14 are removed.

Referring to FIG. 1H, an encapsulant 16 is formed on the first conductive layer 11a for encapsulating the first metal layer 13 and the second metal layer 15.

Referring to FIG. 1I, the encapsulant 16 is partially removed so as to be flush with the second metal layer 15.

Referring to FIG. 1J, a third resist layer 17 is formed on the second conductive layer 11b and has a cavity 170 for exposing a portion of the second conductive layer 11b.

Referring to FIG. 1K, the exposed portion of the second conductive layer 11b and the carrier 10 and the first conductive layer 11a under the second conductive layer 11b are removed.

Referring to FIG. 1L, the third resist layer 17 is removed and a surface finish 18 is formed on surfaces of the first metal layer 13 and the second metal layer 15.

Although having a small thickness, the above-described coreless packaging substrate still requires two electroplating processes, thus resulting in a high fabrication cost.

FIG. 2 is a schematic cross-sectional view showing a carrier-free semiconductor package 2 as disclosed by US Patent Application Publication No. 2012/0007234. A plurality of grooves 200 and a plurality of conductive pillars 201 corresponding to the grooves 200 are formed in a metal carrier by etching. Each of the conductive pillars 201 corresponds in position to an electrical terminal or a chip pad. The grooves 200 are filled with an encapsulant 21. The semiconductor package 2 dispenses with two electroplating processes to thereby save the fabrication cost.

However, since the inner portion of each of the conductive pillars 201 has a bell shape due to the etching process, after a thermal cycling test, the encapsulant 21 can easily crack and the conductive pillars 201 can easily fall off from the semiconductor package 2.

Therefore, how to overcome the above-described drawbacks has become critical.

SUMMARY OF THE INVENTION

In view of the above-described drawbacks, the present invention provides a packaging substrate, which comprises: a metal board having a first surface and a second surface opposite to the first surface, wherein the first surface has a plurality of first openings for defining a first core circuit layer therebetween, the second surface has a plurality of second openings for defining a second core circuit layer therebetween, each of the first and second openings has a wide outer portion and a narrow inner portion, and the inner portion of each of the second openings is in communication with the inner portion of a corresponding one of the first openings; a first encapsulant formed in the first openings; a second encapsulant formed in the second openings; and a surface circuit layer formed on the first encapsulant and the first core circuit layer.

The present invention further provides a semiconductor package, which comprises: a packaging substrate including a metal board having a first surface and a second surface opposite to the first surface, wherein the first surface has a plurality of first openings for defining a first core circuit layer therebetween, the second surface has a plurality of second openings for defining a second core circuit layer therebetween, each of the first and second openings has a wide outer portion and a narrow inner portion, and the inner portion of each of the second openings is in communication with the inner portion of a corresponding one of the first openings; a first encapsulant formed in the first openings; a second encapsulant formed in the second openings; and a surface circuit layer formed on the first encapsulant and the first core circuit layer; a semiconductor chip disposed on the packaging substrate and electrically connected to the surface circuit layer; and a third encapsulant formed on the packaging substrate for encapsulating the semiconductor chip.

The present invention further provides a fabrication method of a packaging substrate, which comprises the steps of: providing a metal board having a first surface and a second surface opposite to the first surface and forming a plurality of first openings in the first surface of the metal board so as to define a first core circuit layer between the first openings, wherein each of the first openings has a wide outer portion and a narrow inner portion; forming a first encapsulant on the first surface and in the first openings and forming a plurality of openings in the first encapsulant for exposing the first core circuit layer; forming a surface circuit layer on the first encapsulant and in the openings of the first encapsulant such that the surface circuit layer electrically connects the first core circuit layer; forming a plurality of second openings in the second surface of the metal board so as to define a second core circuit layer between the second openings, wherein each of the second openings has a wide outer portion and a narrow inner portion, and the inner portion of each of the second openings is in communication with the inner portion of a corresponding one of the first openings; and forming a second encapsulant in the second openings.

The present invention provides another fabrication method of a packaging substrate, which comprises the steps of: providing a metal board having a first surface and a second surface opposite to the first surface and forming a plurality of second openings in the second surface of the metal board so as to define a second core circuit layer between the second openings, wherein each of the second openings has a wide outer portion and a narrow inner portion; forming a second encapsulant in the second openings; forming a plurality of first openings in the first surface of the metal board so as to define a first core circuit layer between the first openings, wherein each of the first openings has a wide outer portion and a narrow inner portion, and the inner portion of each of the first openings is in communication with the inner portion of a corresponding one of the second openings; forming a first encapsulant on the first surface and in the first openings and forming a plurality of openings in the first encapsulant for exposing the first core circuit layer; and forming a surface circuit layer on the first encapsulant and in the openings of the first encapsulant such that the surface circuit layer electrically connects the first core circuit layer.

The present invention further provides a fabrication method of a semiconductor package, which comprises the steps of: providing a packaging substrate, which includes a metal board having a first surface and a second surface opposite to the first surface, wherein the first surface has a plurality of first openings for defining a first core circuit layer therebetween, the second surface has a plurality of second openings for defining a second core circuit layer therebetween, each of the first and second openings has a wide outer portion and a narrow inner portion, and the inner portion of each of the second openings is in communication with the inner portion of a corresponding one of the first openings; a first encapsulant formed in the first openings; a second encapsulant formed in the second openings; and a surface circuit layer formed on the first encapsulant and the first core circuit layer; disposing a semiconductor chip on the packaging substrate and electrically connecting the semiconductor chip and the surface circuit layer; and forming a third encapsulant on the packaging substrate for encapsulating the semiconductor chip.

According to the present invention, a plurality of openings are formed in upper and lower surfaces of a metal board by etching and filled with encapsulants so as to define core circuit layers on the upper and lower surfaces, thus eliminating the need of two electroplating processes as required in the prior art and hence simplifying the fabrication process. Further, since interfaces formed between the core circuit layers and the encapsulants at positions proximate to the surfaces of the metal board are substantially perpendicular to the surfaces of the metal board, cracking of the encapsulants can be alleviated. Furthermore, the core circuit layers have middle portions protruding outwards for engaging with the encapsulants, thereby effectively preventing delamination of the core circuit layers.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as "top", "bottom", "on" etc. are only used as a matter of descriptive convenience and not intended to have any other significance or provide limitations for the present invention.

First Embodiment

FIGS. 3A to 3I are schematic cross-sectional views showing a packaging substrate and a fabrication method thereof according to a first embodiment of the present invention.

Figure 1A:
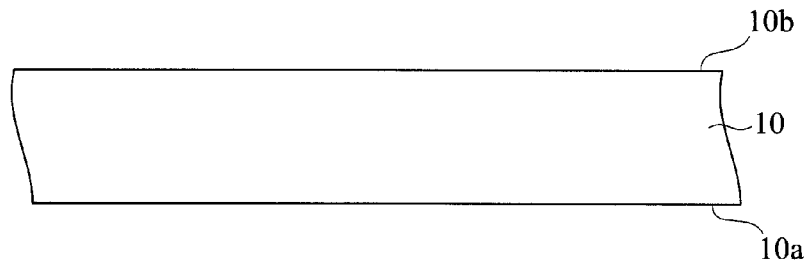
FIGS. 1A and 1L are schematic cross-sectional views showing a conventional QFN (Quad Flat Non-leaded) semiconductor package and a fabrication method thereof.
Figure 1B:
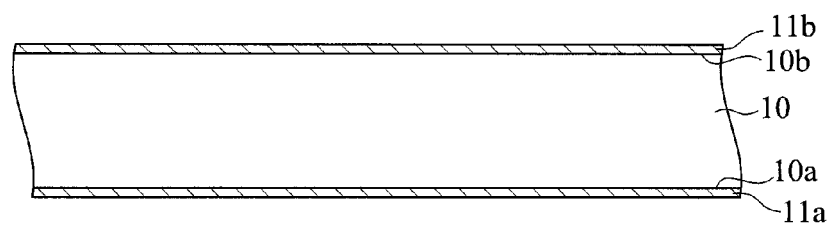
Figure 1C:
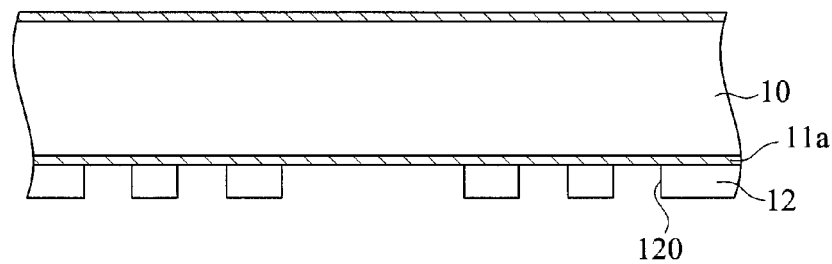
Figure 1D:
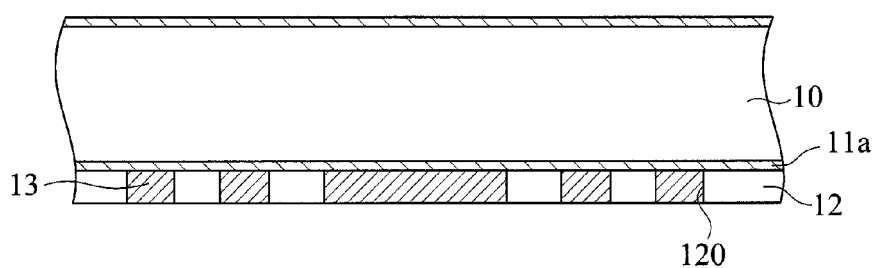
Figure 1E:
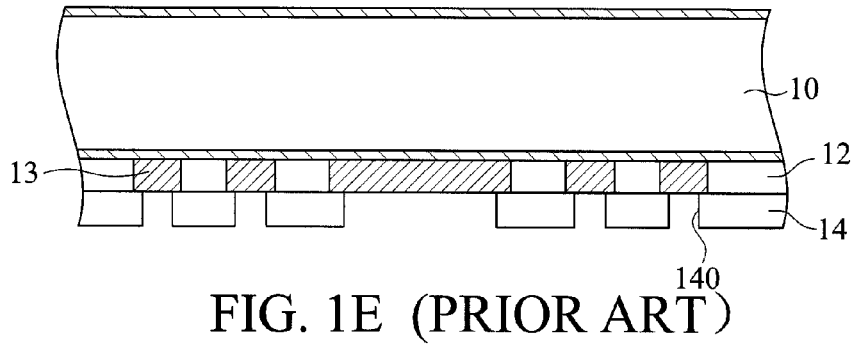
Figure 1F:
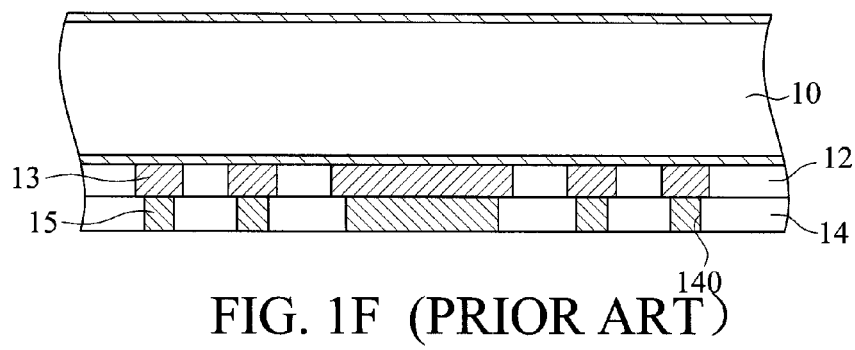
Figure 1G:
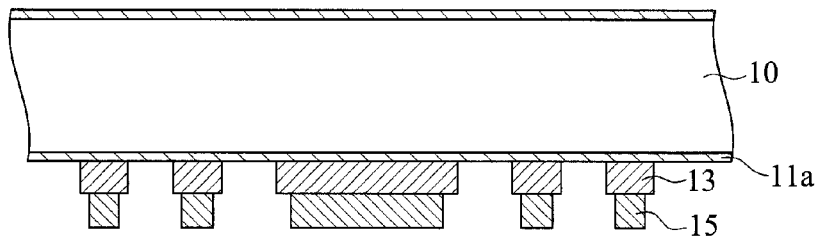
Figure 1H:
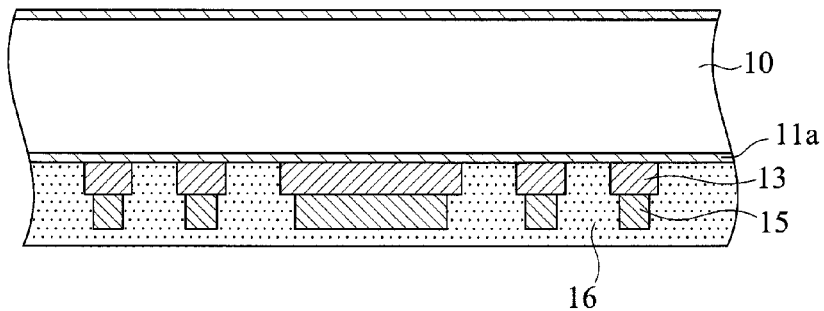
Figure 1I:
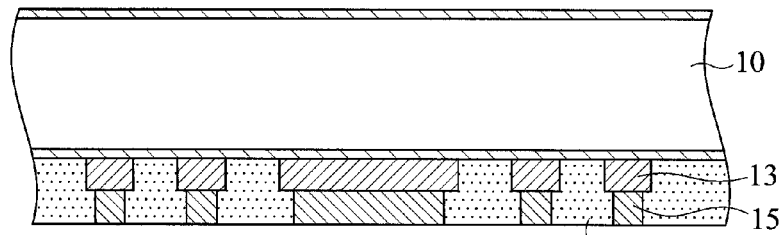
Figure 1J:
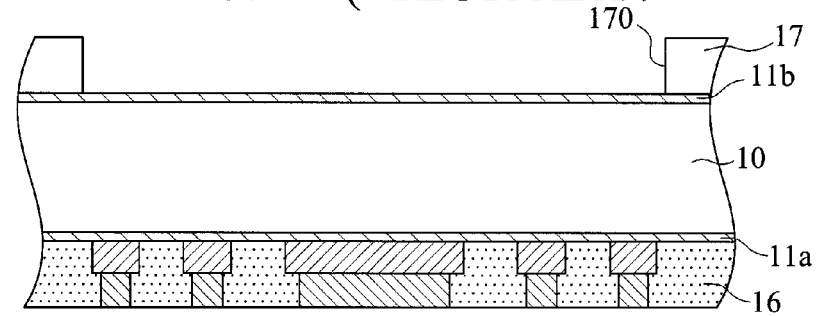
Figure 1K:
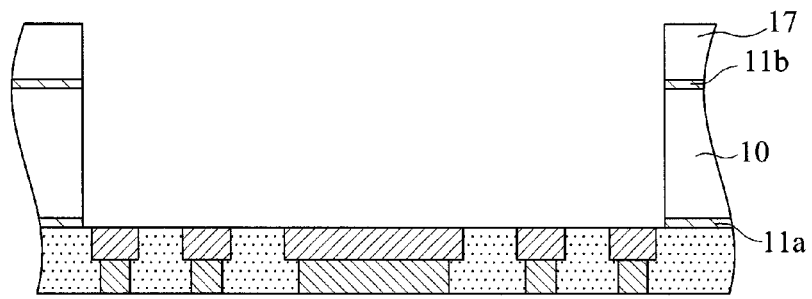
Figure 1L:
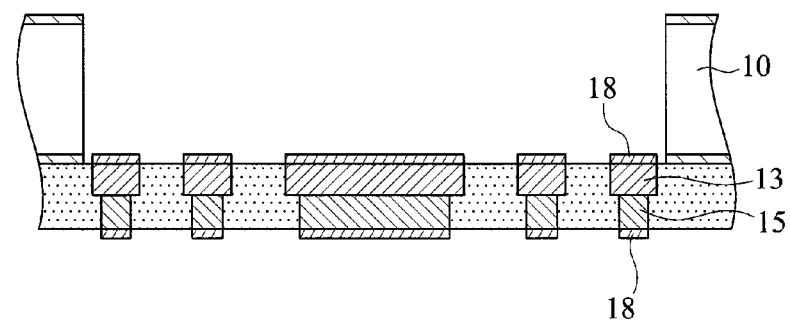
Figure 2:
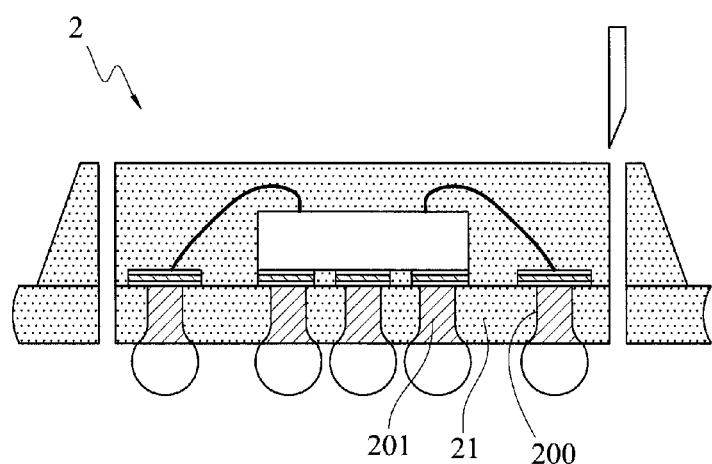
FIG. 2 is a schematic cross-sectional view showing a conventional carrier-free semiconductor package.
Figure 3A:
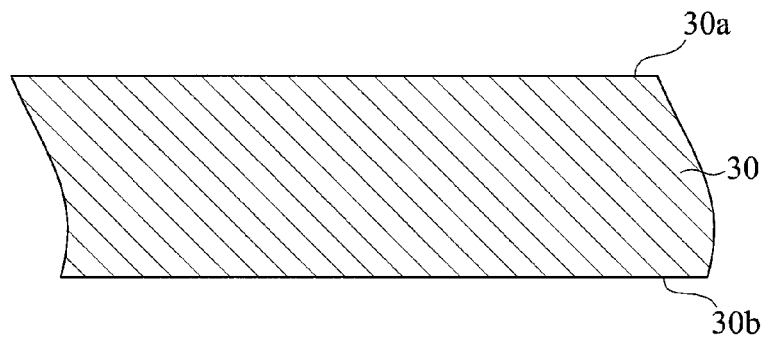
FIGS. 3A to 3I' are schematic cross-sectional views showing a packaging substrate and a fabrication method thereof according to a first embodiment of the present invention, wherein FIG. 3I' shows another embodiment of FIG. 3I.

Referring to FIG. 3A, a metal board 30 is provided, which has a first surface 30a and a second surface 30b opposite to the first surface 30a.

Figure 3B:
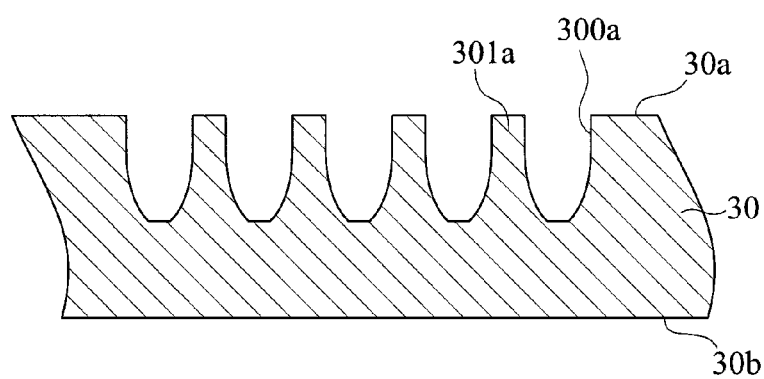

Referring to FIG. 3B, a plurality of first openings 300a are formed in the first surface 30a of the metal board 30 by etching, for example, such that a first core circuit layer 301a is defined between the first openings 300a. Each of the first openings 300a has a wide outer portion and a narrow inner portion.

Figure 3C:
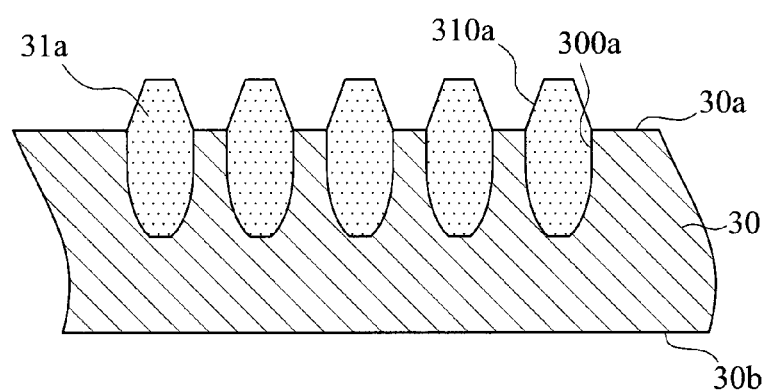

Referring to FIG. 3C, a first encapsulant 31a is formed in the first openings 300a and a plurality of openings 310a are formed in the first encapsulant 31a for exposing the first core circuit layer 301a.

Figure 3D:
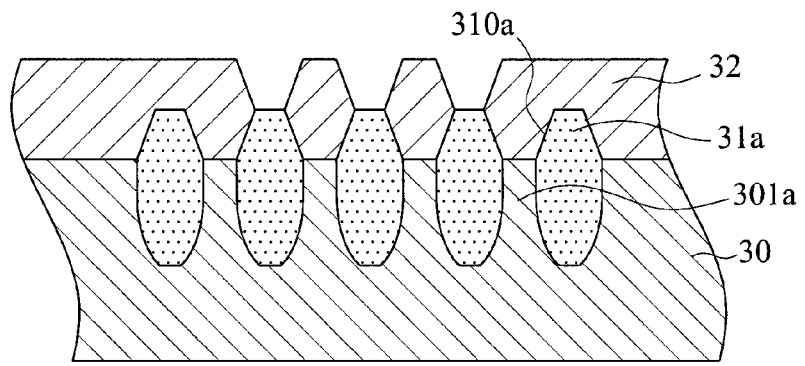

Referring to FIG. 3D, by performing as an electroplating process, a surface circuit layer 32 is formed on the first encapsulant 31a and in the openings 310a of the first encapsulant 31a so as to electrically connect the first core circuit layer 301a.

Figure 3E:
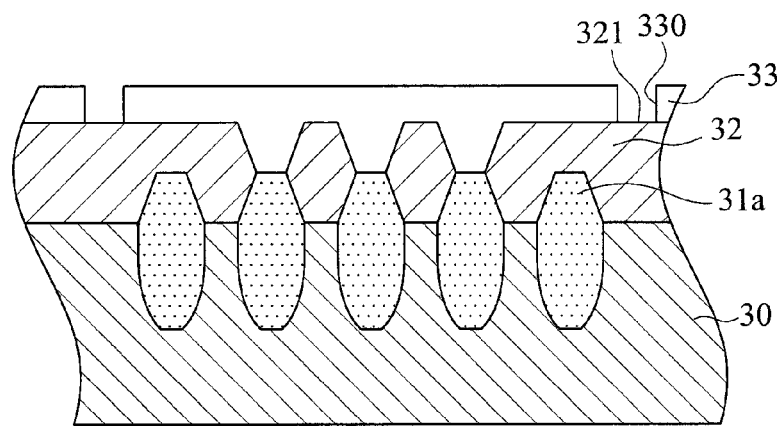

Referring to FIG. 3E, an insulating layer 33 is formed on the first encapsulant 31a and the surface circuit layer 32, and a plurality of openings 330 are formed in the insulating layer 33 for exposing electrical contacts 321 of the surface circuit layer 32.

Figure 3F:
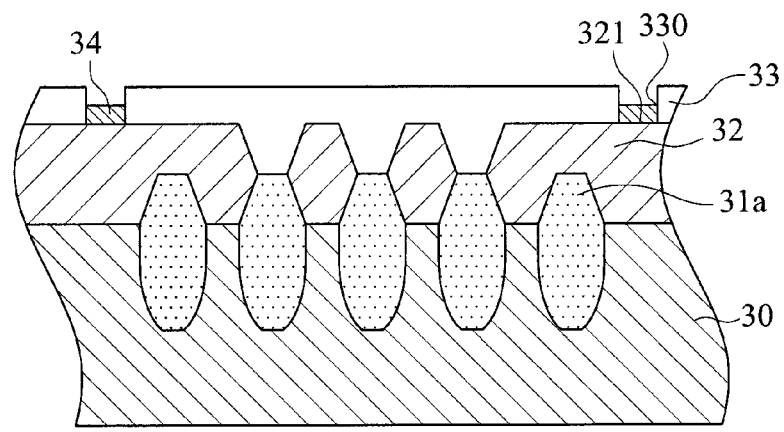

Referring to FIG. 3F, a surface finish 34 is formed on the electrical contacts 321 exposed through the openings 330 of the insulating layer 33.

Figure 3G:
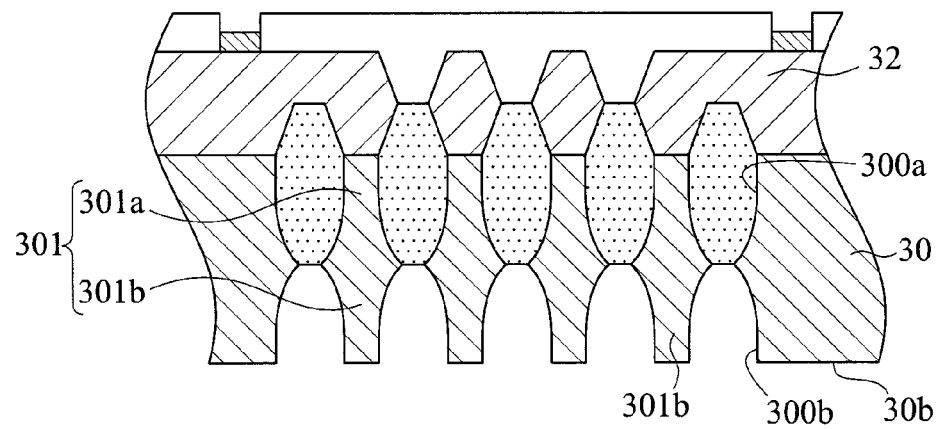

Referring to FIG. 3G, a plurality of second openings 300b are formed in the second surface 30b of the metal board 30 such that a second core circuit layer 301b is defined between the second openings 300b. Each of the second openings 300b has a wide outer portion and a narrow inner portion. The inner portion of each of the second openings 300b is in communication with the inner portion of a corresponding one of the first openings 300a. The first core circuit layer 301a and the second core circuit layer 301b form a core circuit layer 301. The core circuit layer 301 is horizontally divided into a plurality of separated portions through the first openings 300a and the second openings 300b.

Figure 3H:
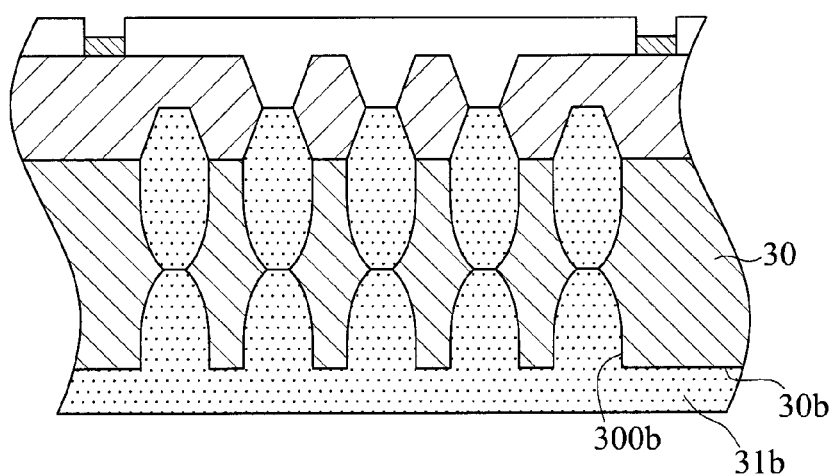

Referring to FIG. 3H, a second encapsulant 31b is formed in the second openings 300b and on the second surface 30b of the metal board 30.

Figure 3I:
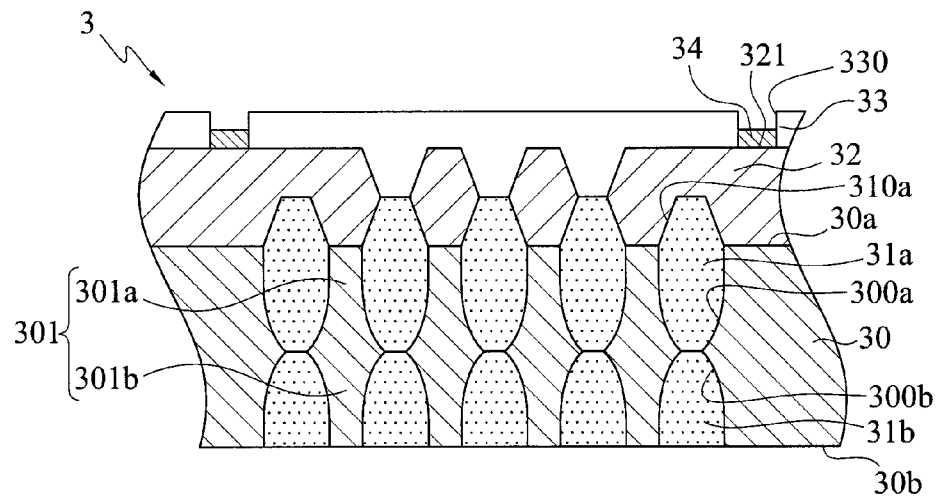
Figure 3I:
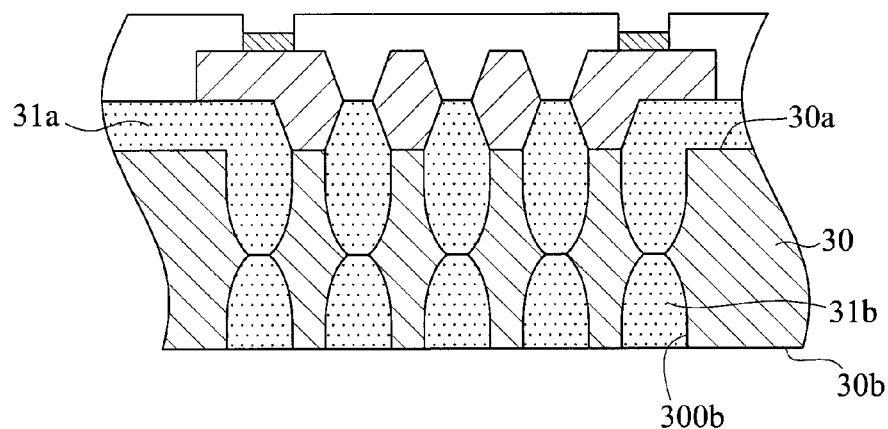

Referring to FIG. 3I, the second encapsulant 31b on the second surface 30b is removed by grinding, for example, so as to obtain a packaging substrate 3.

Referring to FIG. 3I', in another embodiment, the first encapsulant 31a is further formed on the first surface 30a of the metal board 30.

FIGS. 4A to 4D are schematic cross-sectional views showing a semiconductor package and a fabrication method thereof according to the present invention.

Figure 4A:
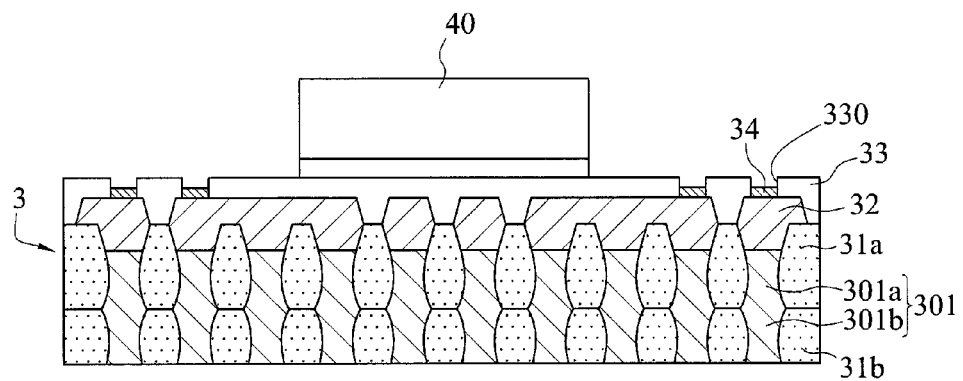
FIGS. 4A to 4D are schematic cross-sectional views showing a semiconductor package and a fabrication method thereof according to the present invention.
Figure 4B:
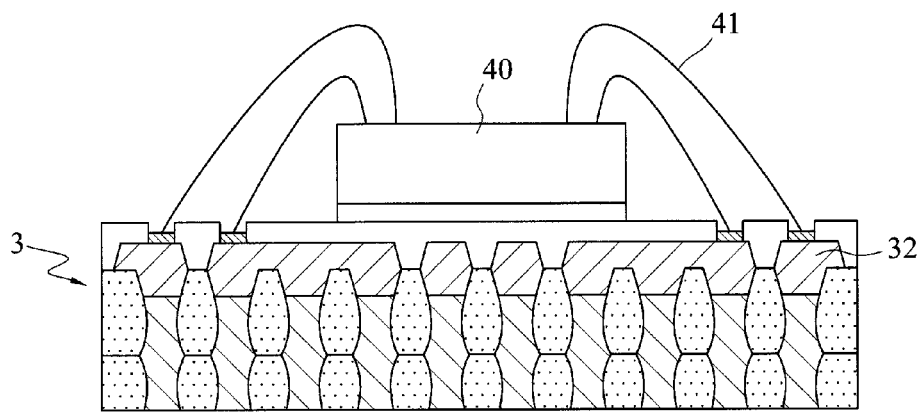

Referring to FIG. 4A, a packaging substrate 3 as shown in FIG. 3I is provided, and a semiconductor chip 40 is disposed on the packaging substrate 3. Referring to FIG. 4B, the semiconductor chip 40 is electrically connected to the surface circuit layer 32 through a plurality of bonding wires 41.

Figure 4C:
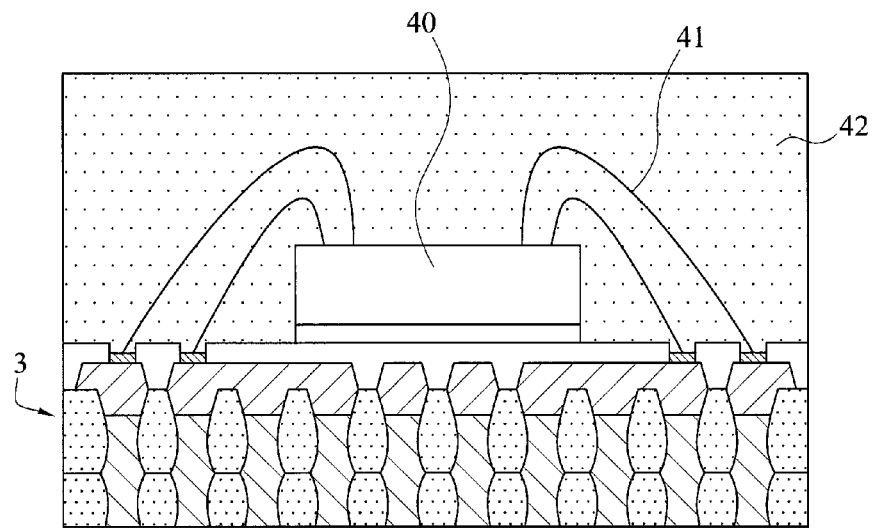

Referring FIG. 4C, a third encapsulant 42 is formed on the packaging substrate 3 for encapsulating the semiconductor chip 40.

Figure 4D:
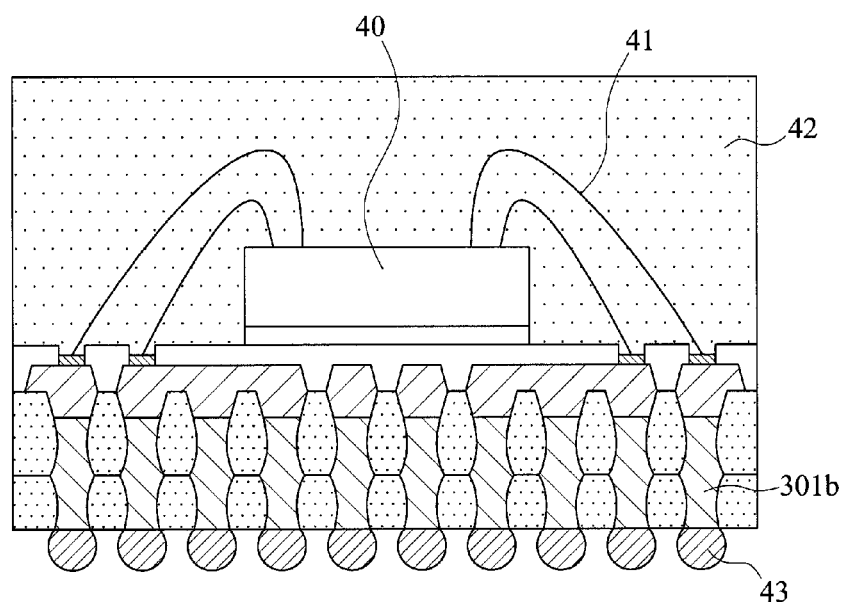

Referring to FIG. 4D, a plurality of solder balls 43 are formed on the second core circuit layer 301b.

Second Embodiment

FIGS. 5A to 5I are schematic cross-sectional views showing a packaging substrate and a fabrication method thereof according to a second embodiment of the present invention.

Figure 5A:
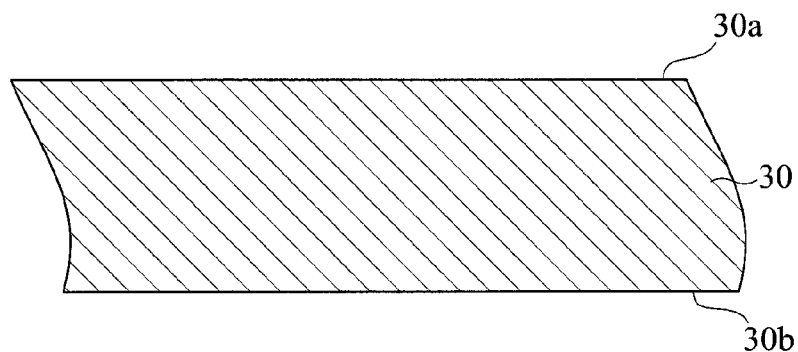
FIGS. 5A to 5I are schematic cross-sectional views showing a packaging substrate and a fabrication method thereof according to a second embodiment of the present invention.

Referring to FIG. 5A, a metal board 30 is provided, which has a first surface 30a and a second surface 30b opposite to the first surface 30a.

Figure 5B:
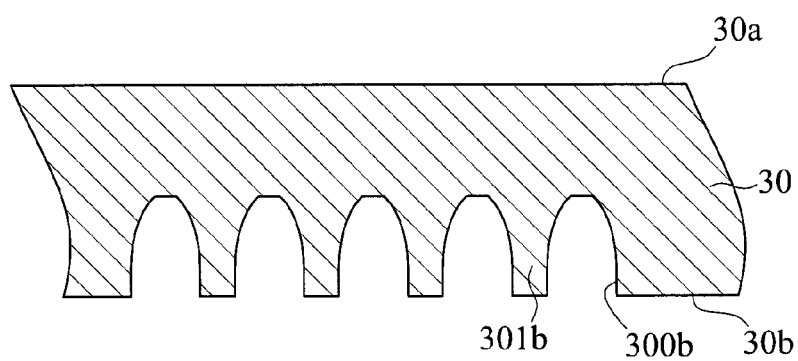

Referring to FIG. 5B, a plurality of second openings 300b are formed in the second surface 30b of the metal board 30 such that a second core circuit layer 301b is defined between the second openings 300b. Each of the second openings 300b has a wide outer portion and a narrow inner portion.

Figure 5C:
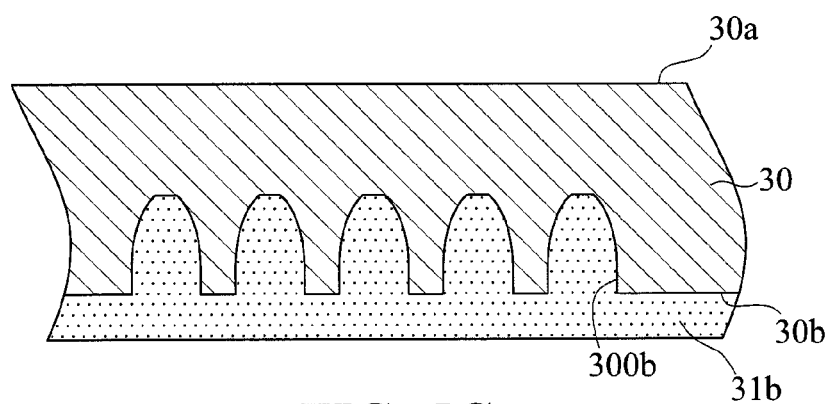

Referring to FIG. 5C, a second encapsulant 31b is formed in the second openings 300b and on the second surface 30b of the metal board 30.

Figure 5D:
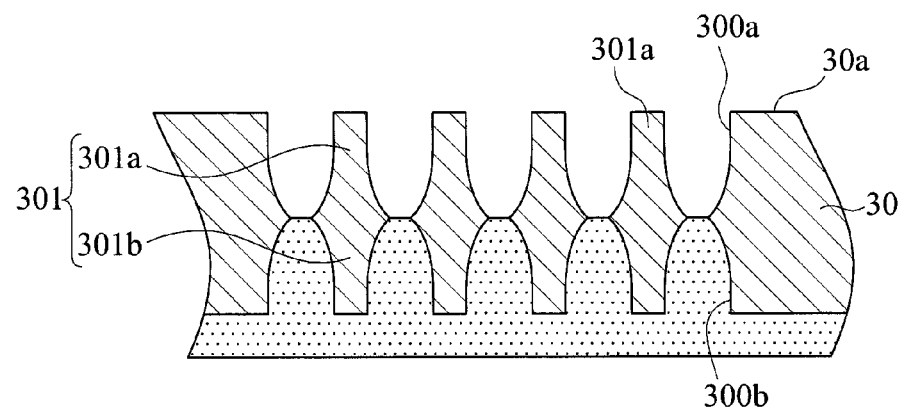

Referring to FIG. 5D, a plurality of first openings 300a are formed in the first surface 30a of the metal board 30 such that a first core circuit layer 301a is defined between the first openings 300a. Each of the first openings 300a has a wide outer portion and a narrow inner portion. The inner portion of each of the first openings 300a is in communication with the inner portion of a corresponding one of the second openings 300b. The first and second core circuit layers 301a, 301b form a core circuit layer 301.

Figure 5E:
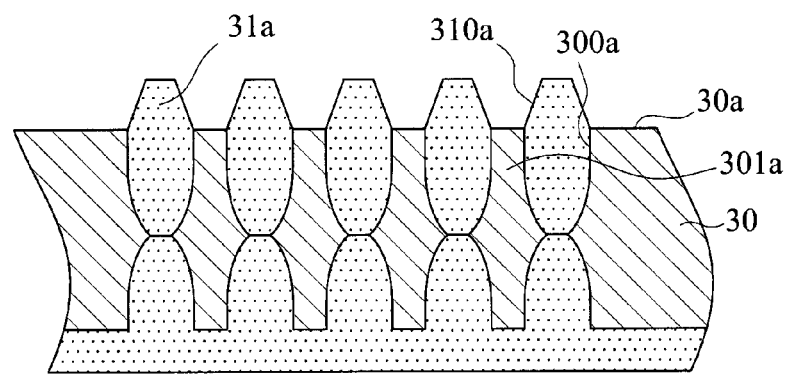

Referring to FIG. 5E, a first encapsulant 31a is formed in the first openings 300a and a plurality of openings 310a are formed in the first encapsulant 31a for exposing the first core circuit layer 301a.

Figure 5F:
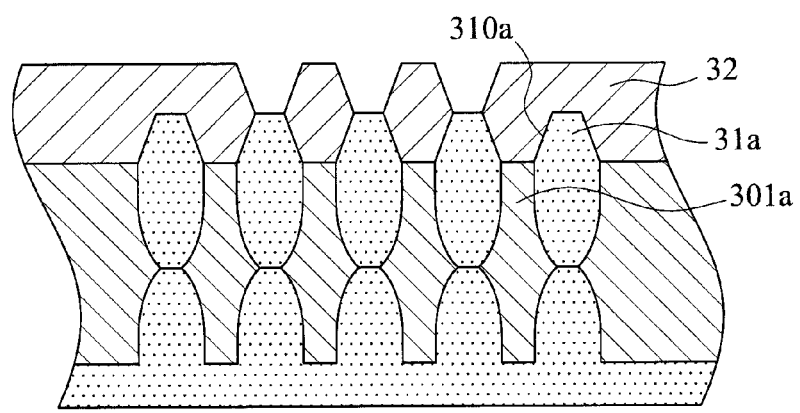

Referring to FIG. 5F, by performing an electroplating process, a surface circuit layer 32 is formed on the first encapsulant 31a and in the openings 310a of the first encapsulant 31a so as to electrically connect the first core circuit layer 301a.

Figure 5G:
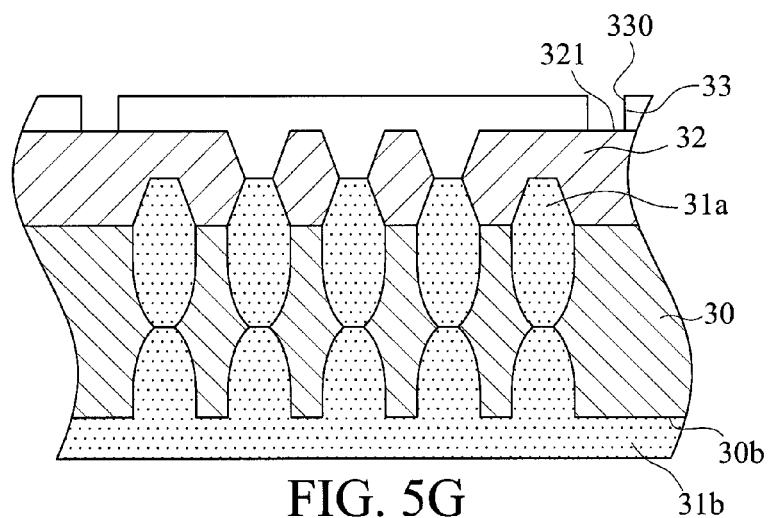

Referring to FIG. 5G, an insulating layer 33 is formed on the first encapsulant 31a and the surface circuit layer 32, and a plurality of openings 330 are formed in the insulating layer 33 for exposing electrical contacts 321 of the surface circuit layer 32, respectively.

Figure 5H:
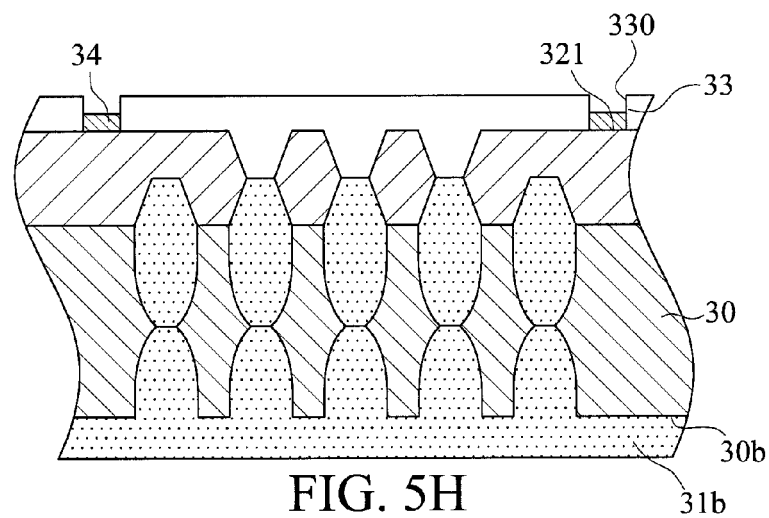

Referring to FIG. 5H, a surface finish 34 is formed on the electrical contacts 321 exposed through the openings 330 of the insulating layer 33.

Figure 5I:
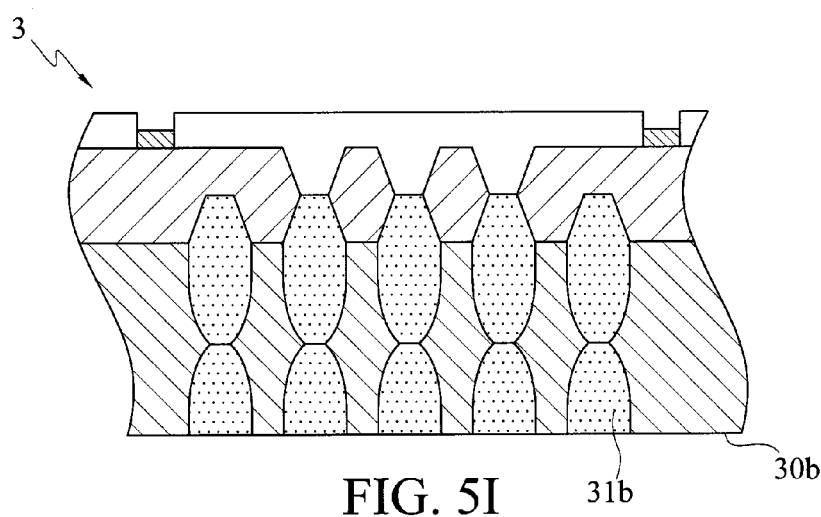

Referring to FIG. 5I, the second encapsulant 31b on the second surface 30b is removed by grinding, for example, so as to obtain a packaging substrate 3.

Further, a semiconductor package can be fabricated as illustrated in the first embodiment.

The present invention further provides a packaging substrate 3, which has: a metal board 30 having a first surface 30a and a second surface 30b opposite to the first surface 30a, wherein the first surface 30a has a plurality of first openings 300a for defining a first core circuit layer 301a therebetween, the second surface 30b has a plurality of second openings 300b for defining a second core circuit layer 301b therebetween, each of the first and second openings 300a, 300b has a wide outer portion and a narrow inner portion, and the inner portion of each of the second openings 300b is in communication with the inner portion of a corresponding one of the first openings 300a; a first encapsulant 31a formed in the first openings 300a; a second encapsulant 31b formed in the second openings 300b; and a surface circuit layer 32 formed on the first encapsulant 31a and the first core circuit layer 301a.

The present invention further provides a semiconductor package, which has: a packaging substrate 3, including: a metal board 30 having a first surface 30a and a second surface 30b opposite to the first surface 30a, wherein the first surface 30a has a plurality of first openings 300a for defining a first core circuit layer 301a therebetween, the second surface 30b has a plurality of second openings 300b for defining a second core circuit layer 301b therebetween, each of the first and second openings 300a, 300b has a wide outer portion and a narrow inner portion, and the inner portion of each of the second openings 300b is in communication with the inner portion of a corresponding one of the first openings 300a; a first encapsulant 31a formed in the first openings 300a; a second encapsulant 31b formed in the second openings 300b; and a surface circuit layer 32 formed on the first encapsulant 31a and the first core circuit layer 301a; a semiconductor chip 40 disposed on the packaging substrate 3 and electrically connected to the surface circuit layer 32; and a third encapsulant 42 formed on the packaging substrate 3 for encapsulating the semiconductor chip 40.

According to the present invention, a plurality of openings are formed in upper and lower surfaces of a metal board by etching and filled with encapsulants so as to define core circuit layers on the upper and lower surfaces, thus eliminating the need of two electroplating processes as required in the prior art and hence simplifying the fabrication process. Further, since interfaces formed between the core circuit layers and the encapsulants at positions proximate to the surfaces of the metal board are substantially perpendicular to the surfaces of the metal board, cracking of the encapsulants can be alleviated. Furthermore, the core circuit layers have middle portions protruding outwards for engaging with the encapsulants, thereby effectively preventing delamination of the core circuit layers.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A packaging substrate, comprising:
a metal board having a first surface and a second surface opposite to the first surface, wherein the first surface has a plurality of first openings for defining a first core circuit layer therebetween, the second surface has a plurality of second openings for defining a second core circuit layer therebetween, each of the first and second openings has a wide outer portion and a narrow inner portion, and the inner portion of each of the second openings is in communication with the inner portion of a corresponding one of the first openings;

a first encapsulant formed in the first openings;

a second encapsulant formed in the second openings; and a surface circuit layer formed on the first encapsulant and the first core circuit layer.

2. The packaging substrate of claim 1, further comprising an insulating layer formed on the first encapsulant and the surface circuit layer, the insulating layer having a plurality of openings for exposing electrical contacts of the surface circuit layer.

3. The packaging substrate of claim 2, further comprising a surface finish formed on the electrical contacts exposed through the openings of the insulating layer.

4. The packaging substrate of claim 1, wherein the first encapsulant is further formed on the first surface of the metal board.

5. A semiconductor package, comprising:

a packaging substrate, comprising:

a metal board having a first surface and a second surface opposite to the first surface, wherein the first surface has a plurality of first openings for defining a first core circuit layer therebetween, the second surface has a plurality of second openings for defining a second core circuit layer therebetween, each of the first and second openings has a wide outer portion and a narrow inner portion, and the inner portion of each of the second openings is in communication with the inner portion of a corresponding one of the first openings;

a first encapsulant formed in the first openings;

a second encapsulant formed in the second openings; and a surface circuit layer formed on the first encapsulant and the first core circuit layer;

a semiconductor chip disposed on the packaging substrate and electrically connected to the surface circuit layer; and a third encapsulant formed on the packaging substrate for encapsulating the semiconductor chip.

6. The semiconductor package of claim 5, further comprising an insulating layer formed on the first encapsulant and the surface circuit layer, the insulating layer having a plurality of openings for exposing electrical contacts of the surface circuit layer.

7. The semiconductor package of claim 6, further comprising a surface finish formed on the electrical contacts exposed through the openings of the insulating layer.

8. The semiconductor package of claim 5, further comprising a plurality of solder balls formed on the second core circuit layer.

9. The semiconductor package of claim 5, wherein the first encapsulant is further formed on the first surface of the metal board.

* * * * *